(12) United States Patent
Chung et al.

(10) Patent No.: US 6,686,284 B2
(45) Date of Patent: Feb. 3, 2004

(54) CHEMICAL MECHANICAL POLISHER EQUIPPED WITH CHILLED RETAINING RING AND METHOD OF USING

(75) Inventors: Chi-Wei Chung, Douliou (TW); Tung-Ching Tseng, Hsindian (TW); Tsu Shih, Hsin-Chu (TW); Syun-Ming Jang, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 153 days.

(21) Appl. No.: 10/072,244

(22) Filed: Feb. 6, 2002

(65) Prior Publication Data

US 2003/0148615 A1 Aug. 7, 2003

(51) Int. Cl.[7] .................................................. H01L 21/00
(52) U.S. Cl. ............. 438/692; 156/345.27; 156/345.53; 216/88; 216/89; 438/693; 438/745
(58) Field of Search ................................ 216/38, 88, 89; 156/345.12, 345.27, 345.53; 438/692, 693, 745

(56) References Cited

U.S. PATENT DOCUMENTS 6,312,558 B2 * 11/2001 Moore .................... 156/345.12

* cited by examiner

Primary Examiner—William A. Powell
(74) Attorney, Agent, or Firm—Tung & Associates

(57) ABSTRACT

A chemical mechanical polishing apparatus that is equipped with a chilled retaining ring and a method for using the apparatus are described. The retaining ring is mounted therein a heat transfer means such as a metal tube and flowing therethrough a heat exchanging fluid for carrying away heat from the wafer mounted in the retaining ring, resulting in a temperature reduction in the slurry solution that contacts the wafer. The present invention apparatus and method therefore reduces the delamination problem for low k dielectric materials during polishing and the wafer scratching problem.

17 Claims, 2 Drawing Sheets

CHEMICAL MECHANICAL POLISHER EQUIPPED WITH CHILLED RETAINING RING AND METHOD OF USING

FIELD OF THE INVENTION

The present invention generally relates to a chemical mechanical polisher for polishing semiconductor wafers and a method of using and more particularly, relates to a chemical mechanical polisher that is equipped with a chilled retaining ring and a method for using the chemical mechanical polisher.

BACKGROUND OF THE INVENTION

In the fabrication of semiconductor devices from a silicon wafer, a variety of semiconductor processing equipment and tools are utilized. One of these processing tools is used for polishing thin, flat semiconductor wafers to obtain a planarized surface. A planarized surface is highly desirable on a shadow trench isolation (STI) layer, on an inter-layer dielectric (ILD) or on an inter-metal dielectric (IMD) layer which are frequently used in memory devices. The planarization process is important since it enables the use of a high resolution lithographic process to fabricate the next level circuit. The accuracy of a high resolution lithographic process can be achieved only when the process is carried out on a substantially flat surface. The planarization process is therefore an important processing step in the fabrication of semiconductor devices.

A global planarization process can be carried out by a technique known as chemical mechanical polishing or CMP. The process has been widely used on ILD or IMD layers in fabricating modern semiconductor devices. A rotary CMP process is performed by using a rotating platen in combination with a pneumatically actuated polishing head. The process is used primarily for polishing the front surface or the device surface of a semiconductor wafer for achieving planarization and for preparation of the next level processing. A wafer is frequently planarized one or more times during a fabrication process in order for the top surface of the wafer to be as flat as possible. A wafer can be polished in a CMP apparatus by being placed on a carrier and pressed face down on a polishing pad covered with a slurry of colloidal silica or aluminum.

A polishing pad used on a rotating platen is typically constructed in two layers overlying a platen with a resilient layer as an outer layer of the pad. The layers are typically made of a polymeric material such as polyurethane and may include a filler for controlling the dimensional stability of the layers. A polishing pad is typically made several times the diameter of a wafer, in a conventional rotary CMP, while the wafer is kept off-center on the pad in order to prevent polishing a non-planar surface onto the wafer. The wafer itself is also rotated during the polishing process to prevent polishing a tapered profile onto the wafer surface. The axis or rotation of the wafer and the axis of rotation of the pad are deliberately not collinear, however, the two axes must be parallel. It is known that uniformity in wafer polishing by a CMP process is a function of pressure, velocity and concentration of the slurry used.

A CMP process is frequently used in the planarization of an ILD or IMD layer on a semiconductor device. The layers are typically formed of a dielectric material. A most popular dielectric material for such usage is silicon oxide. In a process for polishing a dielectric layer, the goal is to remove typography and yet maintain good uniformity across the entire wafer. The amount of the dielectric material removed is normally between about 5000 Å and about 10,000 Å. The uniformity requirement for ILD or IMD polishing is very stringent since non-uniform dielectric films lead to poor lithography and resulting window etching or plug formation difficulties. The CMP process has also been applied to polishing metals, for instance, in tungsten plug formation and in embedded structures. A metal polishing process involves a polishing chemistry that is significantly different than that required for oxide polishing.

The important component needed in a CMP process is an automated rotating polishing platen and a wafer holder, which both exert a pressure on the wafer and rotate the wafer independently of the rotation of the platen. The polishing or the removal of surface layers is accomplished by a polishing slurry consisting mainly of colloidal silica suspended in deionized water or KOH solution. The slurry is frequently fed by an automatic slurry feeding system in order to ensure the uniform wetting of the polishing pad and the proper delivery and recovery of the slurry. For a high volume wafer fabrication process, automated wafer loading/unloading and a cassette handler are also included in a CMP apparatus.

As the name implies, a CMP process executes a microscopic action of polishing by both chemical and mechanical means. While the exact mechanism for material removal of an oxide layer is not known, it is hypothesized that the surface layer of silicon oxide is removed by a series of chemical reactions which involve the formation of hydrogen bonds with the oxide surface of both the wafer and the slurry particles in a hydrogenation reaction; the formation of hydrogen bonds between the wafer and the slurry; the formation of molecular bonds between the wafer and the slurry; and finally, the breaking of the oxide bond with the wafer or the slurry surface when the slurry particle moves away from the wafer surface. It is generally recognized that the CMP polishing process is not a mechanical abrasion process of slurry against a wafer surface.

While the rotary CMP process provides a number of advantages over the traditional mechanical abrasion type polishing process, a serious drawback for the CMP process is the difficulty in controlling polishing rates and different locations on a wafer surface. Since the polishing rate applied to a wafer surface is generally proportional to the relative velocity of the polishing pad, the polishing rate at a specific point on the wafer surface depends on the distance from the axis of rotation. In other words, the polishing rate obtained at the edge portion of the wafer that is closest to the rotational axis of the polishing pad is less than the polishing rate obtained at the opposite edge of the wafer. Even though this is compensated by rotating the wafer surface during the polishing process such that a uniform average polishing rate can be obtained, the wafer surface, in general, is exposed to a variable polishing rate during the CMP process.

More recently, linear chemical mechanical polishing method has been developed in which the polishing pad is not moved in a rotational manner but instead, in a linear manner. It is therefor named as a linear chemical mechanical polishing process in which a polishing pad is moved in a linear manner in relation to a rotating wafer surface. The linear polishing method affords a more uniform polishing rate across a wafer surface throughout a planarization process for uniformly removing a film layer of the surface of a wafer. One added advantage of the linear CMP system is the simpler construction of the apparatus and therefore not only reducing the cost of the apparatus but also reduces the floor space required in a clean room environment.

A typical linear CMP apparatus 10 is shown in FIGS. 1A and 1B. The linear CMP apparatus 10 is utilized for polishing a semi-conductor wafer 24, i.e. a silicon wafer for removing a film layer of either an insulating material or a wafer from the wafer surface. For instance, the film layer to be removed may include insulating materials such as silicon oxide, silicon nitride or spin-on-glass material or a metal layer such as aluminum, copper or tungsten. Various other materials such as metal alloys or semi-conducting materials such as polysilicon may also be removed.

As shown in FIGS. 1A and 1B, the wafer 24 is mounted on a rotating platform, or wafer holder 18 which rotates at a pre-determined speed. The major difference between the linear polisher 10 and a conventional CMP is that a continuous, or endless belt 12 is utilized instead of a rotating polishing pad. The belt 12 moves in a linear manner in respect to the rotational surface of the wafer 24. The linear belt 12 is mounted in a continuous manner over a pair of rollers 14 which are, in turn, driven by a motor means (not shown) at a pre-determined rotational speed. The rotational motion of the rollers 14 is transformed into a linear motion 26 in respect to the surface of the wafer 24. This is shown in FIG. 1B.

In the linear polisher 10, a polishing pad 30 is adhesively joined to the continuous belt 12 on its outer surface that faces the wafer 24. A polishing assembly 40 is thus formed by the continuous belt 12 and the polishing pad 30 glued thereto. As shown in FIG. 1A, a plurality of polishing pad 30 are utilized which are frequently supplied in rectangular-shaped pieces with a pressure sensitive layer coated on the back side.

The wafer platform 18 and the wafer 24 forms an assembly of a wafer carrier 28. The wafer 24 is normally held in position by a mechanical retainer, commonly known as a retaining ring 16, as shown in FIG. 1B. The major function of the retaining ring 16 is to fix the wafer in position in the wafer carrier 28 during the linear polishing process and thus preventing the wafer from moving horizontally as wafer 24 contacts the polishing pad 30. The wafer carrier 28 is normally operated in a rotational mode such that a more uniform polishing on wafer 24 can be achieved. To further improve the uniformity of linear polishing, a support housing 32 is utilized to provide support to support platen 22 during a polishing process. The support platen 22 provides a supporting platform for the underside of the continuous belt 12 to ensure that the polishing pad 30 makes sufficient contact with the surface of wafer 24 in order to achieve more uniform removal in the surface layer. Typically, the wafer carrier 28 is pressed downwardly against the continuous belt 12 and the polishing pad 30 at a predetermined force such that a suitable polishing rate on the surface of wafer 24 can be obtained. A desirable polishing rate on the wafer surface can therefore be obtained by suitably adjusting forces on the support housing 32, the wafer carrier 28, and the linear speed 26 of the polishing pad 30. A slurry dispenser 20 is further utilized to dispense a slurry solution 34.

Referring now to FIG. 2, wherein an improved CMP head 50, sometimes referred to as a Titan® head which differs from conventional CMP heads in two major respects is shown. First, the Titan® head employs a compliant wafer carrier and second, it utilizes a mechanical linkage (not shown) to constrain tilting of the head, thereby maintaining planarity relative to a polishing pad 42, which in turn allows the head to achieve more uniform flatness of the wafer during polishing. The wafer 24 has one entire face thereof engaged by a flexible membrane 46, which biases the opposite face of the wafer 24 into face-to-face engagement with the polishing pad 42. The polishing head and/or pad 42 are moved relative to each other, in a motion to effect polishing of the wafer 24. The polishing head includes an outer retaining ring 44 surrounding the membrane 46, which also engages the polishing pad 42 and functions to hold the head in a steady, desired position during the polishing process. As shown in FIG. 2, both the retaining ring 44 and the membrane 46 are urged downwardly toward the polishing pad 42 by a linear force indicated by the numeral 48 which is effected through a pneumatic system. Two separate pressure chambers of a retaining ring chamber 60 and a membrane chamber 52 are used during a polishing process. A retaining ring pressure 54 exerts on the retaining ring 44, while a membrane pressure 48 translates into wafer backside pressure. Generally, the wafer retaining pressure in the wafer holder 50 is a function of both the membrane pressure 48 and the retaining ring pressure 54.

During a CMP process, a large volume of a slurry composition is dispensed. The slurry composition and the pressure applied between the wafer surface and the polishing pad determine the rate of polishing or material removal from the wafer surface. The chemistry of the slurry composition plays an important role in the polishing rate of the CMP process. For instance, when polishing oxide films, the rate of removal is twice as fast in a slurry that has a pH of 11 than with a slurry that has a pH of 7. The hardness of the polishing particles contained in the slurry composition should be about the same as the hardness of the film to be removed to avoid damaging the film. A slurry composition typically consists of an abrasive component, i.e, hard particles and components that chemically react with the surface of the substrate.

For instance, a typical oxide polishing slurry composition consists of a colloidal suspension of oxide particles with an average size of 30 nm suspended in an alkali solution at a pH larger than 10. A polishing rate of about 120 nm/min can be achieved by using this slurry composition. Other abrasive components such as ceria suspensions may also be used for glass polishing where large amounts of silicon oxide must be removed. Ceria suspensions act as both the mechanical and the chemical agent in the slurry for achieving high polishing rates, i.e, larger than 500 nm/min. While ceria particles in the slurry composition remove silicon oxide at a higher rate than do silica, silica is still preferred because smoother surfaces can be produced. Other abrasive components, such as alumina ($Al_2O_3$) may also be used in the slurry composition.

In the typical polishing slurry composition of a colloidal suspension of particles, a dispersion agent is also added to facilitate the distribution of the particles in the suspension. During a chemical mechanical polishing process, the temperature of the slurry gradually increases due to the mechanical heat generated between the polishing pad, the wafer surface and the slurry. For instance, in a copper damascene process, chemical mechanical polishing is the critical step to achieve global planarization. However, the existing chemical mechanical polishing system for 0.1 $\mu$m process suffers serious low k dielectric delamination and wafer scratch issues. It has been discovered that in the copper/low k chemical mechanical polishing process, the larger slurry film thickness between the polishing pad and the wafer surface decreases the fluid shear stress at the wafer surface and thus, developing a fluid pressure to support the applied downward force. The smaller shear stress and the smaller contact area between the polishing pad and the wafer surface reduce low k dielectrics delamination and wafer scratching issues effectively. Accordingly, a process to increase the slurry film thickness seems to be the key control issue for the copper/low k dielectrics CMP processes. The low k dielectrics is normally defined as dielectric materials that have a dielectric constant of smaller than 2.5.

It is therefore an object of the present invention to provide a chemical mechanical polisher for a copper/low k dielectric material process that does not have the drawbacks or the shortcomings of the conventional chemical mechanical polishers.

It is another object of the present invention to provide a chemical mechanical polisher for a copper/low k dielectric material process that is equipped with a chilled retaining ring.

It is a further object of the present invention to provide a chemical mechanical polisher for a copper/low k dielectric material process equipped with a heat transfer means in the retaining ring.

It is another further object of the present invention to provide a method for chemical mechanical polishing copper/low k dielectric material without delamination and scratching defects.

It is still another object of the present invention to provide a method for chemical mechanical polishing a copper/low k dielectric structure without the delamination and wafer scratching defects by flowing a heat exchanging fluid into a heat transfer means embedded in a retaining ring to cool a wafer and slurry solution in contact with the wafer.

SUMMARY OF THE INVENTION

In accordance with the present invention, a chemical mechanical polisher that is equipped with a chilled retaining ring and a method for chemical mechanical polishing copper/low k dielectric materials without delamination and wafer scratching defects are provided.

In a preferred embodiment, a chemical mechanical polisher that is equipped with a chilled retaining ring is provided which includes a polishing head equipped with a retaining ring chamber and a retaining ring, the retaining ring receives a membrane chamber therein for contacting and pressing a wafer downwardly onto a polishing pad; a heat transfer means embedded inside the retaining ring for circulating a heat exchanging fluid therethrough for removing heat from the wafer during a polishing process; and a pedestal for mounting a polishing pad on a top surface, the polishing pad intimately engages the wafer during the polishing process.

In the chemical mechanical polisher equipped with a chilled retaining ring, the heat transfer means may further include an inlet and an outlet for circulating the heat exchanging fluid. The polisher may further include a fluid reservoir for holding the heat exchanging fluid, and may further include a temperature controller for controlling the temperature of the heat exchanging fluid. The heat exchanging fluid may be water. The polisher may further include a temperature controller for controlling the temperature of the heat exchanging fluid to below 20° C., or preferably to below 15° C. The heat transfer means may be a coil formed of a metal tube, or a coil formed of a stainless steel tube.

The present invention is further directed to a method for chemical mechanical polishing copper/low k dielectric materials without delamination and wafer scratching defects which can be carried out by the operating steps of forming a retaining ring by embedding a heat transfer means therein; mounting a membrane chamber inside the retaining ring; mounting the retaining ring inside a polishing head; mounting a wafer on the membrane chamber with a surface to be polished exposed; mounting a polishing pad onto a rotatable pedestal; pressing the wafer downwardly onto the polishing pad; and flowing a heat exchanging fluid into the heat transfer means and removing heat from the wafer during a polishing process such that the temperature of the slurry solution is controlled.

The method may further include the step of providing the heat transfer means in a coil of heat transfer tube for flowing the heat exchanging fluid therethrough, or the step of selecting the heat exchanging fluid from one that has a heat capacity of at least that of water, or the step of flowing the heat exchanging fluid of water at a temperature below 20° C. into the heat transfer means, or the step of flowing the heat exchanging fluid of water at a temperature preferably below 15° C. into the heat transfer means. The method may further include the step of molding the retaining ring with a polymeric material embedding the heat transfer means, or the step of providing a fluid inlet and a fluid outlet in the retaining ring in fluid communication with the heat transfer means.

BRIEF DESCRIPTION OF THE DRAWINGS

These and other objects, features and advantages of the present invention will become apparent from the following detailed description and the appended drawings in which.

DETAILED DESCRIPTION OF THE PREFERRED EMBODIMENT

The present invention discloses a chemical mechanical polisher that is equipped with a chilled retaining ring for controlling the temperature of a wafer, and thus the slurry solution contacting the wafer during a chemical mechanical polishing process.

The polisher is constructed with a polishing head including a retaining ring, a heat transfer means embedded in the retaining ring for circulating a heat exchanging fluid therethrough, and a pedestal for mounting a polishing pad to intimately engage the wafer during the polishing process. The heat transfer means embedded in the retaining ring can be advantageously fabricated by molding the heat transfer means in a polymeric material to form the retaining ring in a mold. The heat transfer means may further be molded inside the retaining ring in fluid communication with an inlet and an outlet into and out of the retaining ring for circulating a heat exchanging fluid.

The invention further discloses a method for chemical mechanical polishing a copper/low k dielectric structure without causing delamination and wafer scratching problems. The method can be carried out by forming a retaining ring with a heat transfer means embedded therein, i.e. by an injection molding process utilizing a polymeric material embedding a metal coil. After a wafer mounted inside the retaining ring engages a polishing pad during a chemical mechanical polishing process, a heat exchanging fluid is flown through the heat transfer means embedded in the retaining ring to chill the temperature of the ring and thus the temperature of the wafer. The temperature of the slurry solution can thus be controlled through heat transfer with the wafer surface.

Figure 3:
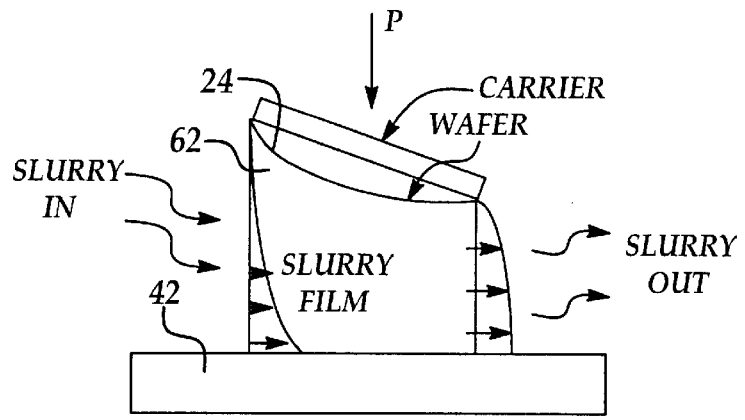
FIG. 3 is a graph illustrating the interaction of a slurry film with a wafer and a polishing pad.

Referring now to FIG. 3, wherein a graph illustrating the interaction between a slurry film 62, a wafer 24 and a polishing pad 42 is shown. It is seen that based on the lubrication theory, the thickness of the slurry film 62 between the polishing pad 42 and the wafer 24 is proportional to the viscosity $\mu$ of the slurry solution. It is noted that for a copper/low k dielectric chemical mechanical polishing process, the larger thickness of the slurry film between the polishing pad and the wafer surface decreases the fluid shear stress at the wafer surface and thus, developing the fluid pressure to support the applied downward force. As a result, the smaller shear stress and the smaller contact area between the polishing pad 42 and the wafer 24 reduces the low k dielectric delamination problem and the wafer scratching problem. It is therefore a unique discovery of the present invention that how to increase the slurry film thickness is the key control issue for the copper/low k dielectric polishing process.

The present invention provides a unique solution to increase the thickness of the hydrodynamic layer between the polishing pad 42 and the wafer surface 24 by lowering the slurry and platen temperature. The low k dielectric delamination problem and the wafer scratching problem can thus be effectively controlled by the decrease in the slurry temperature.

Since the slurry film thickness is proportional to the slurry viscosity, the present invention proposes a unique solution to increase the slurry film thickness by increasing the slurry viscosity. Accordingly, the slurry viscosity can be increased by using a low temperature copper chemical mechanical polishing process resulting in a larger slurry film thickness.

Figure 1A:
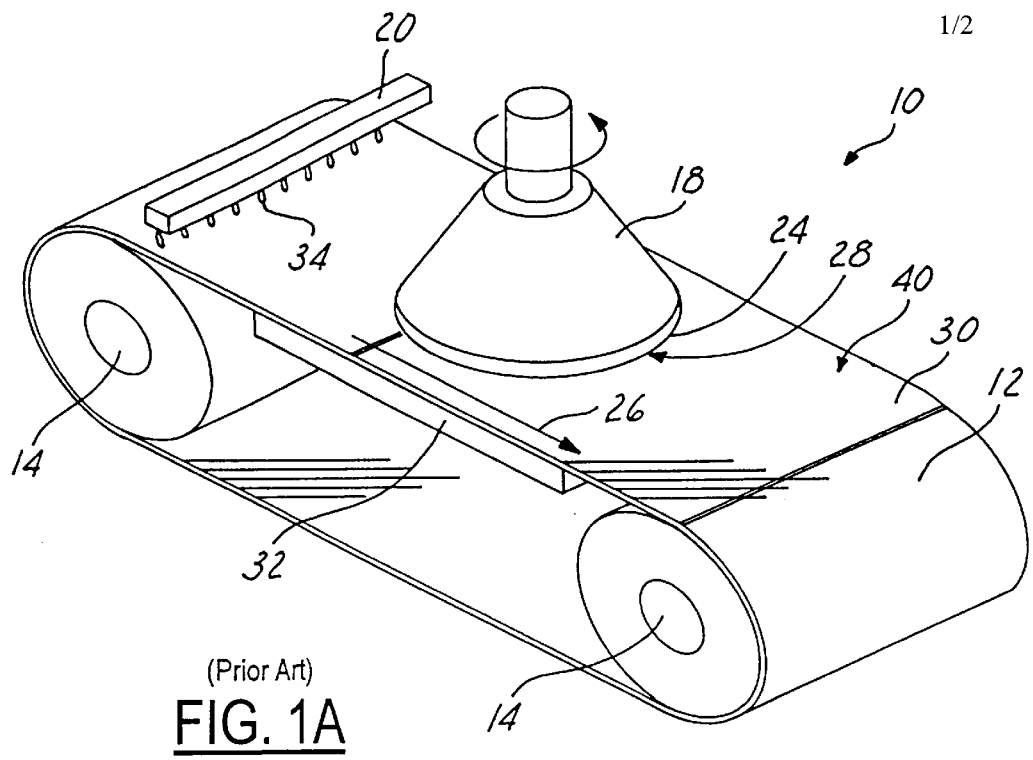
FIG. 1A is a perspective view of a conventional linear chemical mechanical polishing apparatus.
Figure 1B:
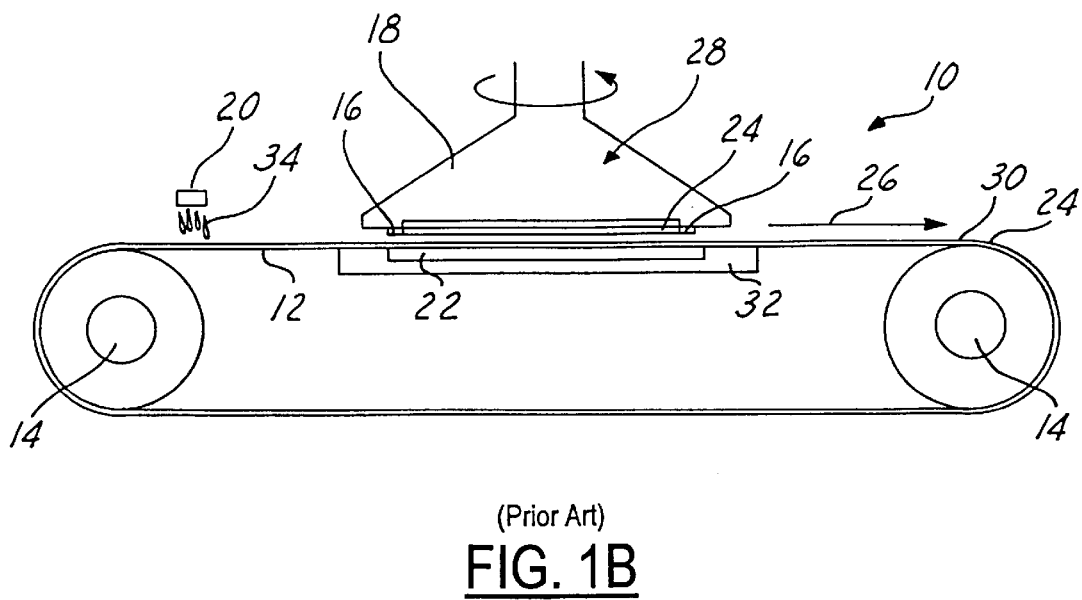
FIG. 1B is a cross-sectional view of the conventional linear chemical mechanical polishing apparatus of FIG. 1A.
Figure 2:
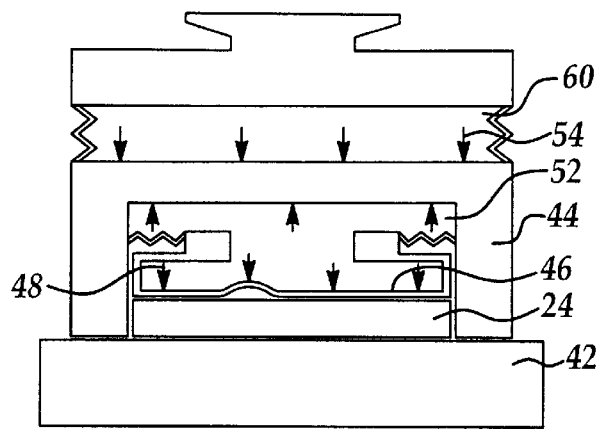
FIG. 2 is a cross-sectional view of a conventional membrane-pressured wafer holder equipped with a retaining ring for the chemical mechanical polishing apparatus.
Figure 4:
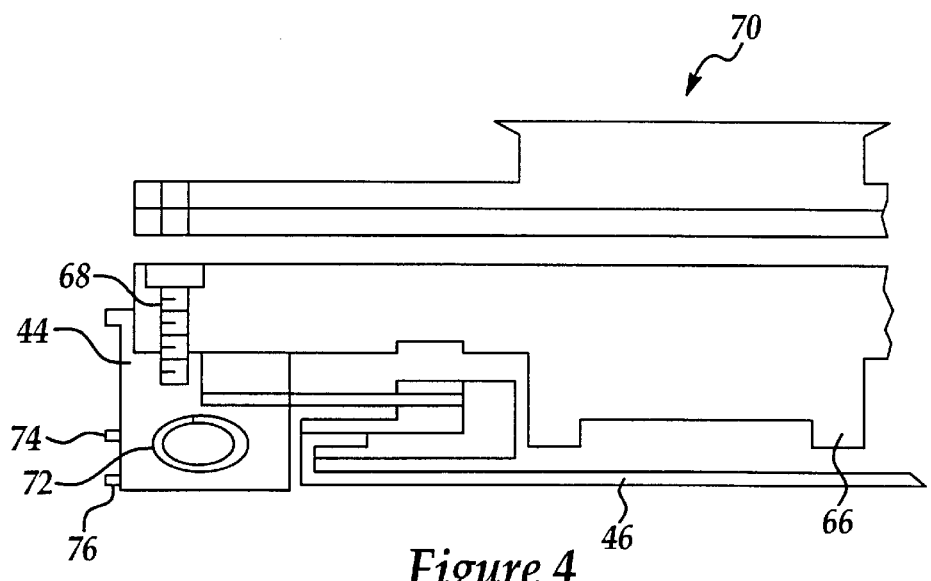
FIG. 4 is an enlarged, partial cross-sectional view of the present invention wafer holder incorporating a retaining ring equipped with a heat transfer means.

Referring now to FIG. 4, wherein a partial, enlarged, cross-sectional view of the present invention wafer head 70 is shown. The retaining ring 44 is shown in more detail than in FIG. 2. For instance, the retaining ring 44 is shown fastened to a carrier member 66 by retaining ring clamp screw 68. The membrane 46 is used for mounting a wafer (not shown) thereto in the wafer head 70. A heat transfer means 72 is provided in the retaining ring 44 in the shape of a continuous coil formed of a metal tube. A suitable metal tube may be a stainless steel tube formed in a continuous coil having an inlet 74 and an outlet 76. The inlet 74 and the outlet 76 are used for flowing into and out of the heat transfer means 72 a heat exchanging fluid such that the temperature of the retaining ring 44 can be suitably controlled. For instance, the temperature of the retaining coil should be reduced by at least 5° C., and preferably 10° C. during a chemical mechanical polishing process. A suitable heat exchanging fluid used in the present invention method can be a fluid that has a heat capacity at least that of water. The heat transfer means 72 of the metal coil can be suitably molded into the retaining ring 44 when the retaining ring is formed of a polymeric material by a molding process. A suitable material for the metal coil of the heat transfer means 72 can be stainless steel. By decreasing the slurry temperature through the use of the heat transfer means in the retaining ring 44, the viscosity of the slurry solution can be increased, resulting in an increased thickness of the slurry film. The delamination problem for the low k dielectric material and the wafer scratching problem can thus be reduced or eliminated.

The present invention novel apparatus and method for controlling the slurry temperature during a chemical mechanical polishing process of either a linear or rotary process, by utilizing a chilled retaining ring have therefore been amply described in the above description and in the appended drawings of FIGS. 3 and 4.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A chemical mechanical polisher equipped with a chilled retaining ring comprising:
    a polishing head equipped with a retaining ring chamber and a retaining ring, said retaining ring receives a membrane chamber therein for contacting and pressing a wafer downwardly onto a polishing pad;
    a heat transfer means embedded inside said retaining ring for circulating a heat exchanging fluid therethrough for removing heat from said wafer during a polishing process; and
    a pedestal for mounting a polishing pad on a top surface, said polishing pad intimately engages said wafer during said polishing process.

2. A chemical mechanical polisher equipped with a chilled retaining ring according to claim 1, wherein said heat transfer means further comprises an inlet and an outlet for circulating said heat exchanging fluid.

3. A chemical mechanical polisher equipped with a chilled retaining ring according to claim 1 further comprising a fluid reservoir for holding said heat exchanging fluid.

4. A chemical mechanical polisher equipped with a chilled retaining ring according to claim 1 further comprising a temperature controller for controlling the temperature of said heat exchanging fluid.

5. A chemical mechanical polisher equipped with a chilled retaining ring according to claim 1, wherein said heat exchanging fluid is $H_2O$.

6. A chemical mechanical polisher equipped with a chilled retaining ring according to claim 1 further comprising a temperature controller for controlling the temperature of said heat exchanging fluid to below 20° C.

7. A chemical mechanical polisher equipped with a chilled retaining ring according to claim 1 further comprising a temperature controller for controlling the temperature of a heat exchanging fluid of water to below 20° C.

8. A chemical mechanical polisher equipped with a chilled retaining ring according to claim 1 further comprising a temperature controller for controlling the temperature of said heat exchanging fluid preferably to below 15° C.

9. A chemical mechanical polisher equipped with a chilled retaining ring according to claim 1, wherein said heat transfer means is a coil formed of a metal tube.

10. A chemical mechanical polisher equipped with a chilled retaining ring according to claim 1, wherein said heat transfer means is a coil formed of a stainless steel tube.

11. A method for chemical mechanical polishing copper/low k dielectric material without delamination and scratching defects comprising the steps of:
    forming a retaining ring by embedding a heat transfer means therein;
    mounting a membrane chamber inside said retaining ring;

mounting said retaining ring inside a polishing head;

mounting a wafer on said membrane chamber with a surface to be polished exposed;

mounting a polishing pad onto a rotatable pedestal;

pressing said wafer downwardly onto said polishing pad; and flowing a heat exchanging fluid into said heat transfer means and removing heat from said wafer during a polishing process such that the temperature of the slurry solution is controlled.

12. A method for chemical mechanical polishing copper/low k dielectric material without delamination and scratching defects according to claim 11 further comprising the step of providing said heat transfer means in a coil of heat transfer tube for flowing said heat exchanging fluid therethrough.

13. A method for chemical mechanical polishing copper/low k dielectric material without delamination and scratching defects according to claim 11 further comprising the step of selecting said heat exchanging fluid from one having a heat capacity of at least that of water.

14. A method for chemical mechanical polishing copper/low k dielectric material without delamination and scratching defects according to claim 11 further comprising the step of flowing said heat exchanging fluid of water at a temperature below 20° C. into said heat transfer means.

15. A method for chemical mechanical polishing copper/low k dielectric material without delamination and scratching defects according to claim 11 further comprising the step of flowing said heat exchanging fluid of water at a temperature preferably below 15° C. into said heat transfer means.

16. A method for chemical mechanical polishing copper/low k dielectric material without delamination and scratching defects according to claim 11 further comprising the step of molding said retaining ring with a polymeric material embedding said heat transfer means.

17. A method for chemical mechanical polishing copper/low k dielectric material without delamination and scratching defects according to claim 11 further comprising the step of providing a fluid inlet and a fluid outlet in said retaining ring in fluid communication with said heat transfer means.

* * * * *